(12) United States Patent
Imai et al.

(10) Patent No.: US 10,243,010 B2
(45) Date of Patent: Mar. 26, 2019

(54) SEMICONDUCTOR SUBSTRATE AND DISPLAY DEVICE

(71) Applicant: Sharp Kabushiki Kaisha, Sakai, Osaka (JP)

(72) Inventors: Hajime Imai, Sakai (JP); Tohru Daitoh, Sakai (JP); Hisao Ochi, Sakai (JP); Tetsuo Fujita, Sakai (JP); Hideki Kitagawa, Sakai (JP); Tetsuo Kikuchi, Sakai (JP); Masahiko Suzuki, Sakai (JP); Teruyuki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/779,655

(22) PCT Filed: Nov. 28, 2016

(86) PCT No.: PCT/JP2016/085117
§ 371 (c)(1),
(2) Date: May 29, 2018

(87) PCT Pub. No.: WO2017/094644
PCT Pub. Date: Jun. 8, 2017

(65) Prior Publication Data
US 2018/0261628 A1 Sep. 13, 2018

(30) Foreign Application Priority Data

Nov. 30, 2015 (JP) ................................. 2015-233606

(51) Int. Cl.
| | |
|---|---|
| *H01L 27/12* | (2006.01) |
| *G02F 1/1368* | (2006.01) |
| *G09F 9/30* | (2006.01) |
| *H01L 29/786* | (2006.01) |
| *G02F 1/1333* | (2006.01) |
| *G02F 1/1335* | (2006.01) |
| *G06F 3/041* | (2006.01) |

(52) U.S. Cl.
CPC .......... *H01L 27/124* (2013.01); *G02F 1/1368* (2013.01); *G02F 1/13338* (2013.01);
(Continued)

(58) Field of Classification Search
CPC ............... H01L 27/124; H01L 27/1225; H01L 27/1259; H01L 29/786; G06F 3/0412;
(Continued)

(56) References Cited

U.S. PATENT DOCUMENTS 6,407,782 B1 * 6/2002 Kim .................. G02F 1/133516
349/106
6,927,809 B2 * 8/2005 Gotoh ............... G02F 1/136209
257/59
(Continued)

FOREIGN PATENT DOCUMENTS

JP 2015-064854 A 4/2015
JP 2015-072662 A 4/2015
(Continued)

*Primary Examiner* — Savitri Mulpuri
(74) *Attorney, Agent, or Firm* — Keating & Bennett, LLP

(57) ABSTRACT

A semiconductor film 21 is provided so as to overlap with a light-shielding film 11 when viewed in a plan view. A second insulating film 30 has a contact hole CH1 that reaches a source electrode 22 and a drain electrode 23. A gate electrode 41 is provided on the second insulating film 30 so as to overlap with the semiconductor film 21 when viewed in a plan view, and at the same time, so as to overlap with none of the source electrode 22 and the drain electrode 23 when viewed in a plan view. A third insulating film 50 is provided on the second insulating film 30 so as to cover the gate electrode 41, and at the same time, so as to be in contact with the source electrode 22 and the drain electrode 23 through the contact hole CH1.

6 Claims, 19 Drawing Sheets

(52) U.S. Cl.
CPC ...... *G02F 1/133512* (2013.01); *G06F 3/0412* (2013.01); *G09F 9/30* (2013.01); *H01L 27/1225* (2013.01); *H01L 27/1259* (2013.01); *H01L 29/786* (2013.01); *G02F 2001/13685* (2013.01); *G02F 2201/121* (2013.01); *G02F 2201/123* (2013.01)

(58) Field of Classification Search
CPC ........... G02F 1/133512; G02F 1/13338; G02F 1/1368; G02F 2201/123; G02F 201/121; G02F 2001/13685; G09F 9/30
See application file for complete search history.

(56) References Cited

U.S. PATENT DOCUMENTS

| | | | | |
|---|---|---|---|---|
| 7,123,323 | B2 * | 10/2006 | Honbo | G02F 1/136209 349/111 |
| 7,132,801 | B2 * | 11/2006 | Park | H01L 27/3253 315/169.3 |
| 7,180,559 | B2 * | 2/2007 | Chang | G02F 1/134336 349/106 |
| 7,666,695 | B2 * | 2/2010 | Jeoung | G02F 1/136227 257/E33.001 |
| 8,107,038 | B2 * | 1/2012 | Kim | G02F 1/136209 345/88 |
| 8,502,231 | B2 * | 8/2013 | Arao | G02F 1/136209 257/59 |
| 8,654,270 | B2 * | 2/2014 | Nakajima | G02F 1/1345 349/43 |
| 9,250,490 | B2 * | 2/2016 | Shibata | G02F 1/13454 |
| 9,508,750 | B2 * | 11/2016 | Hiwatashi | H01L 27/124 |
| 2015/0084912 | A1 | 3/2015 | Seo et al. | |
| 2015/0097810 | A1 | 4/2015 | Aoki et al. | |
| 2015/0145821 | A1 | 5/2015 | Kim et al. | |

FOREIGN PATENT DOCUMENTS

| | | |
|---|---|---|
| JP | 2015-072663 A | 4/2015 |
| JP | 2015-106411 A | 6/2015 |

\* cited by examiner

SEMICONDUCTOR SUBSTRATE AND DISPLAY DEVICE

TECHNICAL FIELD

The present invention relates to a semiconductor substrate and a display device, and particularly relates to a semiconductor substrate used in a display device equipped with a touch sensor.

BACKGROUND ART

Examples of a display device equipped with a touch sensor in recent years include the following: an upper plate added type (add-on type) that is obtained by preparing a display device and a touch panel individually and thereafter attaching the touch panel to the display device; and an upper plate integrated type (on-cell type) that is obtained by forming a touch sensor directly on a surface of an upper glass substrate of a display device. The display device of the upper plate integrated type has a smaller thickness as compared with the display device of the upper plate added type, and still further, a display device of a touch sensor integrated type has been developed as a display device of a further thinner type.

For example, Patent Document 1 discloses a display device of a touch sensor integrated type that includes: a plurality of gate lines and a plurality of data lines that intersect with one another; a plurality of pixel electrodes formed in areas defined by the gate lines and the data lines intersecting with one another; and a plurality of common electrodes that are formed so as to overlap with the pixel electrodes, respectively. In this display device, the common electrodes also function as common electrodes of the display, as well as touch drive electrodes and touch sensing electrodes that compose a touch sensor.

PRIOR ART DOCUMENT

Patent Document

Patent Document 1: JP-A-2015-106411

SUMMARY OF THE INVENTION

Problem to be Solved by the Invention

In the display device disclosed in Patent Document 1, as mentioned above, the TFTs have the bottom gate structure. This results in that, when viewed in a plan view, the gate electrodes and the source electrodes must be arranged so as to overlap each other, respectively, when viewed in a plan view. The configuration in which the gate electrodes and the source electrodes overlap with each other, respectively, when viewed in a plan view causes parasitic capacitances to be generated between the gate electrodes and the source electrodes, respectively, which can cause signals to become dull when the signals are written.

It is an object of the present invention to provide a display device characterized in that the generation of parasitic capacitances is suppressed, and the writing time is short.

Means to Solve the Problem

A semiconductor substrate of the present invention includes: a substrate; a light-shielding film provided on the substrate; a first insulating film provided on the substrate so as to cover the light-shielding film; a semiconductor film provided on the first insulating film so as to overlap with the light-shielding film when viewed in a plan view; a source electrode and a drain electrode provided on the first insulating film so that a part of the same covers the semiconductor film; a second insulating film provided on the first insulating film so as to cover the semiconductor film, the source electrode, and the drain electrode, the second insulating film having a contact hole that reaches the source electrode and the drain electrode; a gate electrode provided on the second insulating film so as to overlap with the semiconductor film when viewed in a plan view, and at the same time, so as to overlap with none of the source electrode and the drain electrode when viewed in a plan view; and a third insulating film provided on the second insulating film so as to cover the gate electrode, and at the same time, so as to be in contact with the source electrode and the drain electrode through the contact hole.

Effect of the Invention

According to the present invention, the source electrodes, the drain electrodes, and the gate electrodes are provided so that the source electrodes and the drain electrodes do not overlap with the gate electrodes when viewed in a plan view, which makes it possible to suppress the generation of a parasitic capacitance, thereby making it possible to obtain a semiconductor substrate and a display device characterized in that the writing time is short.

MODE FOR CARRYING OUT THE INVENTION

Figure 1:
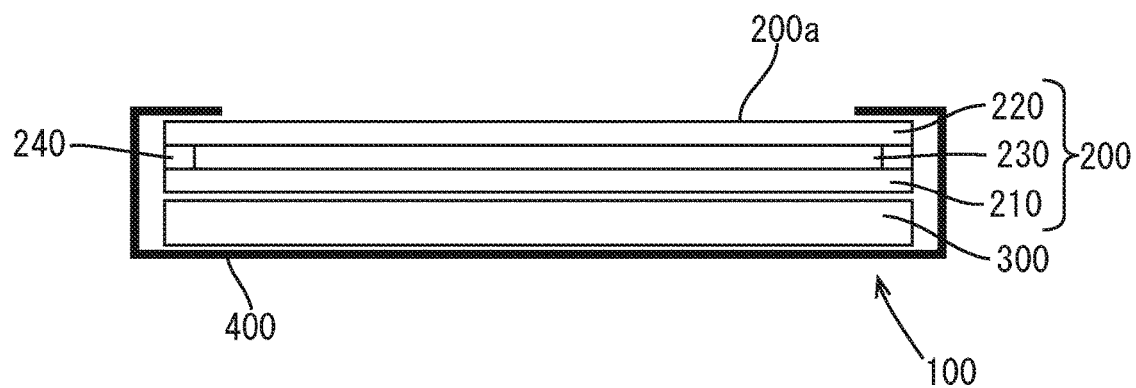
FIG. 1 is an explanatory view schematically illustrating a cross-section configuration of a liquid crystal display device.

A semiconductor substrate of the present invention includes: a substrate; a light-shielding film provided on the substrate; a first insulating film provided on the substrate so as to cover the light-shielding film; a semiconductor film provided on the first insulating film so as to overlap with the light-shielding film when viewed in a plan view; a source electrode and a drain electrode provided on the first insulating film so that a part of the same covers the semiconductor film; a second insulating film provided on the first insulating film so as to cover the semiconductor film, the source electrode, and the drain electrode, the second insulating film having a contact hole that reaches the source electrode and the drain electrode; a gate electrode provided on the second insulating film so as to overlap with the semiconductor film when viewed in a plan view, and at the same time, so as to overlap with none of the source electrode and the drain electrode when viewed in a plan view; and a third insulating film provided on the second insulating film so as to cover the gate electrode, and at the same time, so as to be in contact with the source electrode and the drain electrode through the contact hole (the first configuration).

According to the first configuration, the semiconductor substrate includes a semiconductor film, and a source electrode as well as a drain electrode on a first insulating film, and a second insulating film on the first insulating film, and further includes a gate electrode on the second insulating film. In other words, the semiconductor substrate includes a top gate type semiconductor. This makes the structure such that the gate electrode overlaps with none of the source electrode and the drain electrode when viewed in a plan view. This makes it possible to prevent a parasitic capacitance from being generated between the gate electrode and the source electrode as well as the drain electrode, which results in that a semiconductor substrate characterized in that the writing time is short can be obtained. Since the semiconductor film is provided so as to overlap with the light-shielding film when viewed in a plan view, it is possible to prevent the semiconductor film from being irradiated with light and deteriorating.

The semiconductor substrate of the present invention in the first configuration is further characterized in that the third insulating film, in contact with the source electrode and the drain electrode through the contact hole, is further in contact with the semiconductor film, and the third insulating film has a hydrogen concentration of $1 \times 10^{22}$ cm$^{-3}$ or more (the second configuration).

According to the second configuration, the third insulating film has a hydrogen concentration of $1 \times 10^{22}$ cm$^{-3}$ or more is in contact with the semiconductor film, which allows hydrogen to easily enter the semiconductor film from the third insulating film. When hydrogen enters the semiconductor film, oxygen in the semiconductor film is drawn out, which causes the oxide semiconductor to have a low resistance. As a result, the movement efficiency of electrons in the semiconductor in the semiconductor substrate can be improved.

The semiconductor substrate of the present invention in the first or second configuration is further characterized in that the semiconductor film is made of an oxide semiconductor (the third configuration).

The semiconductor substrate of the present invention in the third configuration is further characterized in that the semiconductor film is made of an In—Ga—Zn—O-based oxide semiconductor (the fourth configuration).

The semiconductor substrate of the present invention in the third or fourth configuration is further characterized in that the semiconductor film is made of a crystalline oxide semiconductor (the fifth configuration).

A display device of the present invention includes a semiconductor substrate in any one of the first to fifth configurations.

The following describes preferred embodiments of the present invention in detail, while referring to the drawings. The drawings referred to in the following description illustrate, for convenience of description, only the principal members necessary for describing the present invention, among the constituent members in the embodiments, in a simplified manner. The present invention, therefore, may include arbitrary constituent members that are not described in the descriptions of the following embodiments. Further, the dimension ratios of the constituent members illustrated in the drawings do not necessarily indicate the real sizes, the real dimension ratios, etc.

Embodiment 1

Embodiment 1 is described with reference to a liquid crystal display device including a backlight device, as an exemplary display device. FIG. 1 is an explanatory view schematically illustrating a cross-section configuration of a liquid crystal display device 100 of Embodiment 1.

The liquid crystal display device 100 includes a liquid crystal display panel 200 that displays an image on a display surface 200a, a backlight device 300 that supplies light to the liquid crystal display panel 200, a case 400 that houses the liquid crystal display panel 200, the backlight device 300, and the like.

The liquid crystal display panel 200 includes a TFT array substrate 210, a counter substrate 220, a liquid crystal layer 230, and a sealing member 240. The TFT array substrate 210 and the counter substrate 220 are arranged so as to be opposed to each other. The TFT array substrate 210 and the counter substrate 220 are bonded to each other with a frame-form sealing member 240. In a space surrounded by the sealing member 240 between the TFT array substrate 210 and the counter substrate 220, a liquid crystal layer 230 is sealed. The liquid crystal display panel 200 operates in a fringe field switching (FFS) mode.

The backlight device 300 is a device that projects light toward the liquid crystal display panel 200, using a light emitting diode (LED) as a light source. The backlight device 300 is arranged on a TFT array substrate 210 side of the liquid crystal display panel 200 as illustrated in FIG. 1, and projects light toward the TFT array substrate 210. In the liquid crystal display panel 200, an image is displayed on the display surface 200a, using light supplied from the backlight device 300.

The liquid crystal display device 100 of the present embodiment is used in electronic equipment of various types: for example, a mobile phone, a smartphone, a laptop-type personal computer, a tablet terminal, a portable information terminal, a digital photoframe, a portable game machine, an electronic ink paper, or the like.

(Liquid Crystal Display Panel)

Figure 2:
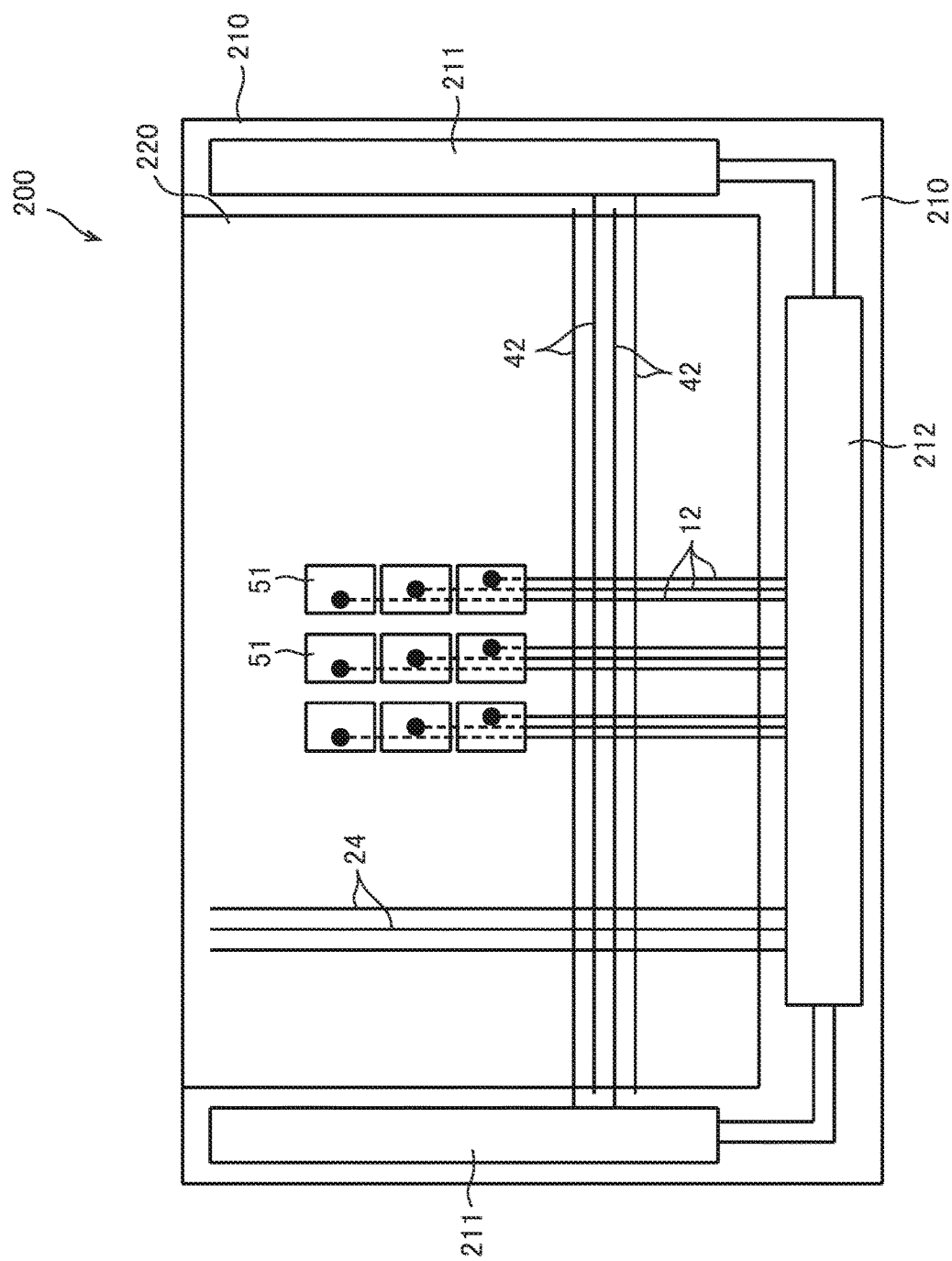
FIG. 2 is a plan view illustrating a liquid crystal panel of Embodiment 1.

FIG. 2 is a plan view illustrating the liquid crystal display panel 200. The liquid crystal display panel 200 includes the TFT array substrate 210, the counter substrate 220, and the liquid crystal layer 230, as described above. The TFT array substrate 210 is a size larger than the counter substrate 220, as illustrated in FIG. 2. On the TFT array substrate 210, in an area thereof outside an area corresponding to the counter substrate 220, as illustrated in FIG. 2, there are formed a gate driver 211, a source driver-cum-touch panel control unit 212, and the like. As illustrated in FIG. 2, a plurality of gate lines 42 are provided so as to be parallel to one another, extending from the gate driver 211. A plurality of source lines 24 and touch panel lines 12 are provided so as to be parallel to one another, extending from the source driver-cum-touch panel control unit 212. The touch panel lines 12 are electrically connected with a common electrode 51 that is described below.

Figure 3:
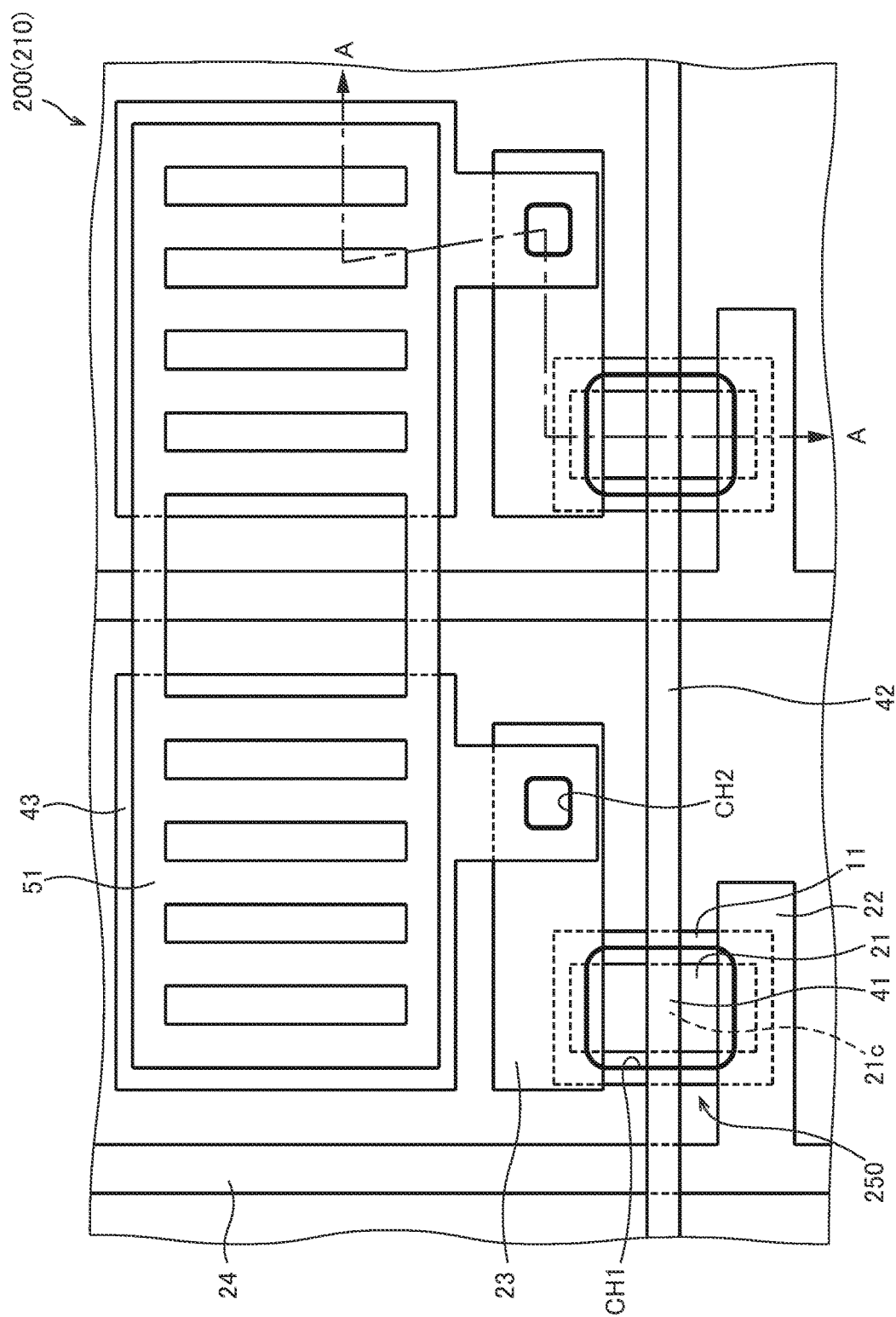
FIG. 3 is a plan view of a liquid crystal panel illustrating a layout of the TFT array substrate of Embodiment 1 in detail.
Figure 4:
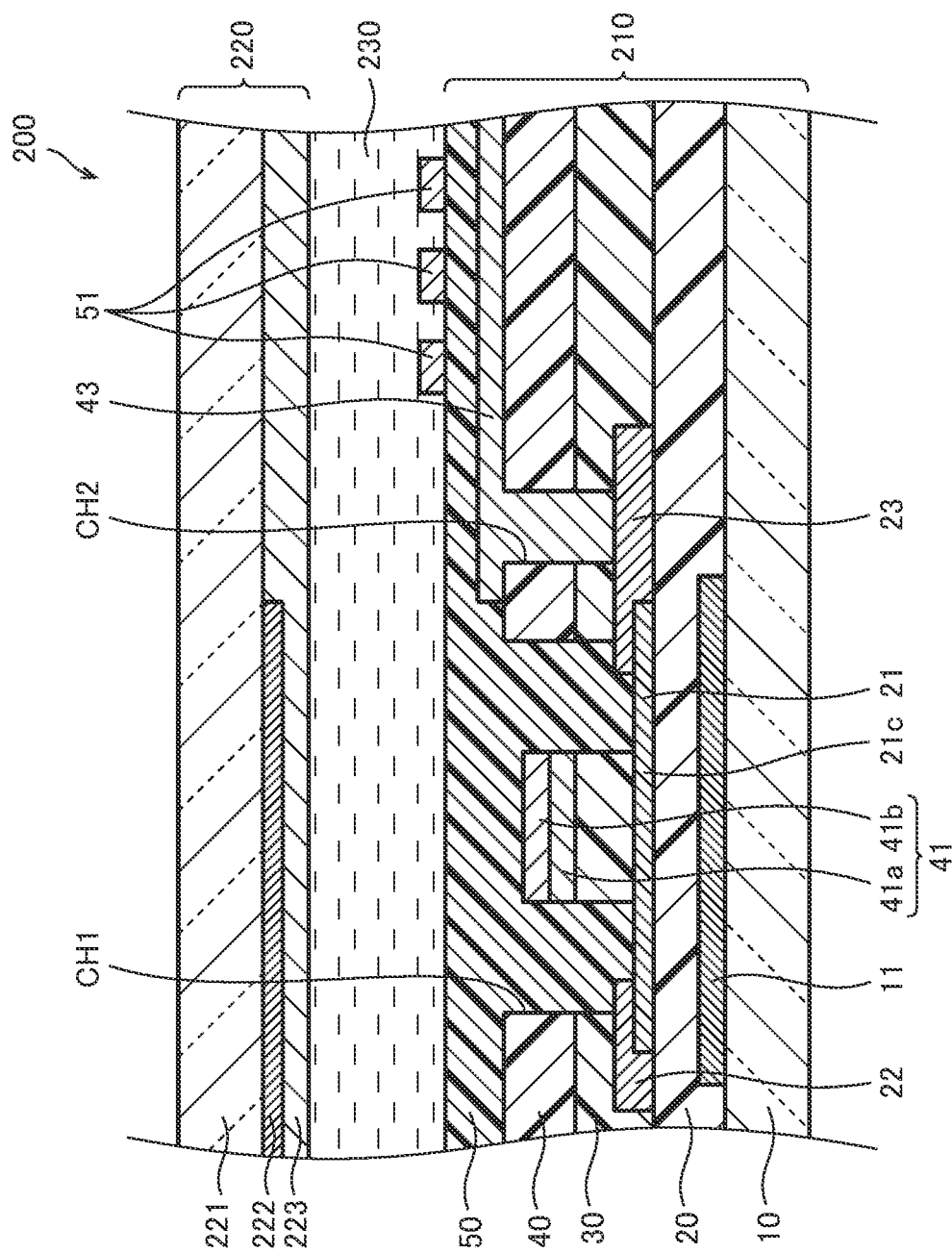
FIG. 4 is a cross-sectional view of the liquid crystal display panel illustrated in FIG. 3, taken along line A-A.

FIG. 3 is a plan view illustrating a layout of the TFT array substrate 210, in the liquid crystal display panel 200. FIG. 4 is a cross-sectional view of the liquid crystal display panel 200 taken along line A-A in FIG. 3.

The TFT array substrate 210 is a semiconductor substrate. The configuration of the TFT array substrate 210 is described below. On a surface of the TFT array substrate 210, on a side opposite to the liquid crystal layer 230, a polarizing plate (not shown) is provided.

The counter substrate 220 has the following configuration, as illustrated in FIG. 4: a substrate (transparent substrate) 221 made of transparent glass, a black matrix 222, a color filter 223 in which coloring parts of red color (R), green color (G), blue color (B), and the like are arranged in a predetermined array, an alignment film (not shown), and the like are arranged therein. On a surface of the counter substrate 220, on a side opposite to the liquid crystal layer 230, a polarizing plate (not shown) is provided.

(TFT Array Substrate)

The following description describes the TFT array substrate 210. The TFT array substrate 210 of the present embodiment includes top gate type TFTs 250.

As illustrated in FIG. 3, the TFT array substrate 210 has the following configuration: a plurality of TFTs 250 as switching elements, a plurality of pixel electrodes 43 connected thereto, and the like are arranged in matrix on the transparent substrate 10. On the TFT array substrate 210, the source lines 24, the gate lines 42, and the like are arranged so as to define the TFTs 250 and the like. More specifically, the TFT array substrate 210, as illustrated in FIGS. 3 and 4, includes the transparent substrate 10, a light-shielding film 11, a first insulating film 20, a semiconductor film 21, source electrodes 22, drain electrodes 23, the source lines 24, a gate insulating film 30, a photosensitive resin film 40, gate electrodes 41, the gate lines 42, the pixel electrodes 43, a passivation film 50, the common electrode 51, the alignment film (not shown), and the like.

The transparent substrate 10 is made of a plate member made of glass, as described above. The transparent substrate 10, however, is not limited to one made of glass, but any one of a variety of substrates can be used. For example, a single crystal semiconductor substrate, an oxide single crystal substrate, a metal substrate, a glass substrate, a quartz substrate, a resin substrate, or any other substrate can be used. In a case where, for example, the transparent substrate 10 is a conductive substrate such as a single crystal semiconductor substrate or a metal substrate, it is preferably used in a state in which an insulating film or the like is provided thereon.

The light-shielding film 11 is formed on the transparent substrate 10. The light-shielding film 11 is formed in such an island-shaped state of being not electrically connected with other constituent members. The light-shielding film 11 is provided in a layer below the semiconductor film 21, so as to shield the semiconductor film 21 from light. The light-shielding film 11 is formed with, for example, a metal film.

The first insulating film 20 is provided on the transparent substrate 10 so as to cover the light-shielding film 11. The first insulating film 20 is formed with, for example, an $SiN_x$ film, or an $SiO_2$ film.

The semiconductor film 21 is formed on the first insulating film 20. The semiconductor film 21 is formed so as to overlap with an area where the light-shielding film 11 is formed, when viewed in a plan view. In order to shield the semiconductor film 21 from light more surely, as illustrated in FIG. 2, the area where the semiconductor film 21 is formed is preferably a size smaller than the area where the light-shielding film 11 is formed. The semiconductor film 21 is formed with an oxide semiconductor.

The oxide semiconductor contained in the semiconductor film 21 may be an amorphous oxide semiconductor, or a crystalline oxide semiconductor that includes crystalline parts. Examples of the crystalline oxide semiconductor include a polycrystalline oxide semiconductor, a microcrystalline oxide semiconductor, a crystalline oxide semiconductor in which the c-axis is aligned approximately vertically to the layer surface.

The semiconductor film 21 may have a laminate structure of two or more layers. In a case where the semiconductor film 21 has a laminate structure, the semiconductor film 21 may include an amorphous oxide semiconductor layer and a crystalline oxide semiconductor layer. Alternatively, the semiconductor film 21 may include a plurality of crystalline oxide semiconductor layers that have different crystal structures. Further, the semiconductor film 21 may include a plurality of amorphous oxide semiconductor layers. In a case where the semiconductor film 21 has a two-layer structure that has an upper layer and a lower layer, it is preferable that the energy gap of the oxide semiconductor contained in the upper layer is greater than the energy gap of the oxide semiconductor contained in the lower layer. In a case where the difference between the energy gaps of these layers is relatively small, however, the energy gap of the oxide semiconductor contained in the lower layer may be greater than the energy gap of the oxide semiconductor contained in the upper layer.

The materials, the structures, and the film forming methods of the amorphous oxide semiconductor and the crystalline oxide semiconductors described above, the configurations of the oxide semiconductor layers having the laminate structures, and the like, are disclosed in, for example, JP-A-2014-007399.

The semiconductor film 21 may contain, for example, at least one metal element among In, Ga, and Zn. In the present embodiment, the semiconductor film 21 contains, for example, an In—Ga—Zn—O-based semiconductor (for example, indium gallium zinc oxide). Here, the In—Ga—Zn—O-based semiconductor is a ternary oxide of indium (In), gallium (Ga), and zinc (Zn), in which the ratio (composition ratio) of In, Ga, and Zn is not limited particularly, and examples of the ratio include In:Ga:Zn=2:2:1, In:Ga:Zn=1:1:1, and In:Ga:Zn=1:1:2. The semiconductor film 21 like this can be formed with an oxide semiconductor film that contains an In—Ga—Zn—O-based semiconductor.

The In—Ga—Zn—O-based oxide semiconductor may be amorphous, or may be crystalline. The In—Ga—Zn—O- based crystalline semiconductor is preferably an In—Ga—Zn—O-based crystalline semiconductor in which the c-axis is aligned approximately vertically to the layer surface.

The crystal structure of the In—Ga—Zn—O-based crystalline oxide semiconductor is disclosed in, for example, JP-A-2014-007399 mentioned above, JP-A-2012-134475, JP-A-2014-209727, etc. Since the TFT including an In—Ga—Zn—O-based semiconductor layer has high mobility (more than 20 times that of an a-Si TFT) and low leakage current (less than one hundredth of that of an a-Si TFT), the same can be preferably used as a driving TFT (for example, a TFT included in a driving circuit that is provided around a display area including a plurality of pixels, on the same substrate as the display area) and a pixel TFT (a TFT provided in a pixel).

The semiconductor film 21 may contain another oxide semiconductor, in place of the In—Ga—Zn—O-based semiconductor. For example, the semiconductor film 21 may contain an In—Sn—Zn—O-based semiconductor (for example $In_2O_3$—$SnO_2$—ZnO; InSnZnO). The In—Sn—Zn—O-based semiconductor is a ternary oxide of indium (In), tin (Sn), and zinc (Zn). Alternatively, the semiconductor film 21 may contain an oxide semiconductor such as an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, In—Ga—Sn—O-based semiconductor, an In—Ga—O-based semiconductor, a Zr—In—Zn—O-based semiconductor, or an Hf—In—Zn—O-based semiconductor.

The source electrodes 22, the drain electrodes 23, and the source lines 24 are formed on the first insulating film 20. A part of the source electrodes 22 and the drain electrodes 23 are formed so as to cover the semiconductor film 21. In the semiconductor film 21, areas between the source electrodes 22 and the drain electrodes 23 form channel areas 21c.

The gate insulating film 30 is formed on the first insulating film 20 so as to cover the semiconductor film 21, the source electrodes 22, the drain electrodes 23, the source lines 24, and the like. The gate insulating film 30 is formed with, for example, an $SiN_x$ film or an $SiO_2$ film.

The photosensitive resin film 40 formed on the gate insulating film 30. The photosensitive resin film 40 is formed with, for example, an organic photosensitive resin such as acryl.

Contact holes CH1, CH2 are formed in the gate insulating film 30 and the photosensitive resin film 40. Each contact hole CH1 is formed in an area where the semiconductor film 21 is formed. In the contact hole CH1, in an area that does not overlap with the channel area 21c, both of the gate insulating film 30 and the photosensitive resin film 40 are removed, so that the semiconductor film 21 is exposed on the surface of the contact hole CH1. In the area that overlaps with the channel area 21c, only the photosensitive resin film 40 is removed, so that the gate insulating film 30 remains.

Each contact hole CH2 is formed in an area where the drain electrode 23 is formed. On the surface of the contact hole CH2, the drain electrode 23 is exposed.

The gate electrode 41 is formed on the gate insulating film 30, as illustrated in FIG. 4. The gate electrode 41 is formed so as to overlap with the channel area 21c of the semiconductor film 21 when viewed in a plan view. The gate line 42 is arranged so as to intersect with the source line 24 at right angles, as illustrated in FIG. 3. The gate electrode 41 and the gate line 42 are formed with a transparent conductive film 41a that is common with the pixel electrode 43, and a metal film 41b covering the same.

The pixel electrode 43 is electrically connected with the drain electrode 23, via the contact hole CH2 formed in the gate insulating film 30 and the photosensitive resin film 40. The pixel electrode 43 is formed with a transparent conductive film.

The passivation film 50 is formed on the photosensitive resin film 40, so as to cover the gate electrodes 41, the pixel electrodes 43, and the like. The passivation film 50 is in contact with the semiconductor film 21 in the contact hole CH1. The passivation film 50 is formed with, for example, an $SiN_x$ film. The passivation film 50 preferably has a hydrogen concentration of $1 \times 10^{22}$ cm$^{-3}$ or more. As the passivation film 50 having a hydrogen concentration of $1 \times 10^{22}$ cm$^{-3}$ or more is in contact with the semiconductor film 21, oxygen is drawn out of an area adjacent to the channel area 21c in the semiconductor film 21, whereby the resistance in the area can be reduced.

The common electrode 51 is formed so as to cover the passivation film 50. The common electrode 51 is formed in a layer above the pixel electrode 43. As illustrated in FIG. 3, the common electrode 51 is a comb-shaped electrode. The common electrode 51 is formed with a transparent conductive film made of, for example, ITO or the like.

The pattern shape of the TFT array substrate 210, and the like, can be checked after the TFT array substrate 210 is disassembled, by observing the same with use of a microscope apparatus such as an optical microscope apparatus, a scanning transmission electron microscope (STEM), or a scanning electron microscope (SEM).

(Method for Producing TFT Array Substrate)

The following description describes a method for producing the TFT array substrate 210 while referring to FIGS. 5 to 18.

First of all, the transparent substrate 10 is prepared. Then, for example, a copper (Cu) film and a titanium (Ti) film are laminated, whereby a light-shielding film is formed. More specifically, for example, a copper (Cu) film and a titanium (Ti) film are formed by the sputtering method, and thereafter, photolithography is performed by wet etching, whereby an island-shaped light-shielding film 11 is formed, as illustrated in FIG. 5.

Figure 5:
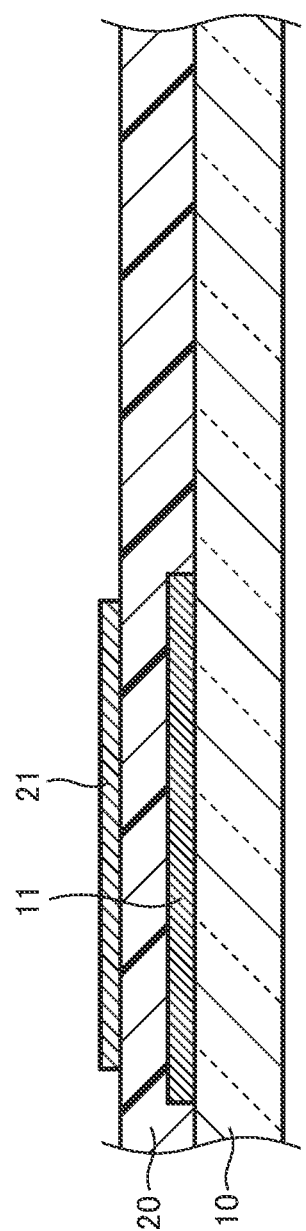
FIG. 5 is a cross-sectional view of a substrate illustrating a step of a TFT array substrate producing process.

Next, for example, an $SiO_2$ film and an SiN film are formed by the CVD method, whereby an insulating film that covers the transparent substrate 10 and the light-shielding film 11 are formed as illustrate in FIG. 5. Then, this insulating film is subjected to photolithography by dry etching, whereby the first insulating film 20 is formed. Alternatively, the first insulating film 20 may be formed by, for example, forming a transparent SOG film by the spin coating method, instead of forming an $SiO_2$ film and an SiN film.

Next, a film of an oxide semiconductor is formed on the first insulating film 20 by, for example, the sputtering method. Then, by using photolithography by the wet etching, the film of the oxide semiconductor is patterned, whereby an island-shaped semiconductor film 21 is formed as illustrated in FIG. 5. Here, the area where the semiconductor film 21 is formed is an area that overlaps with the light-shielding film 11 when viewed in a plan view.

Figure 6:
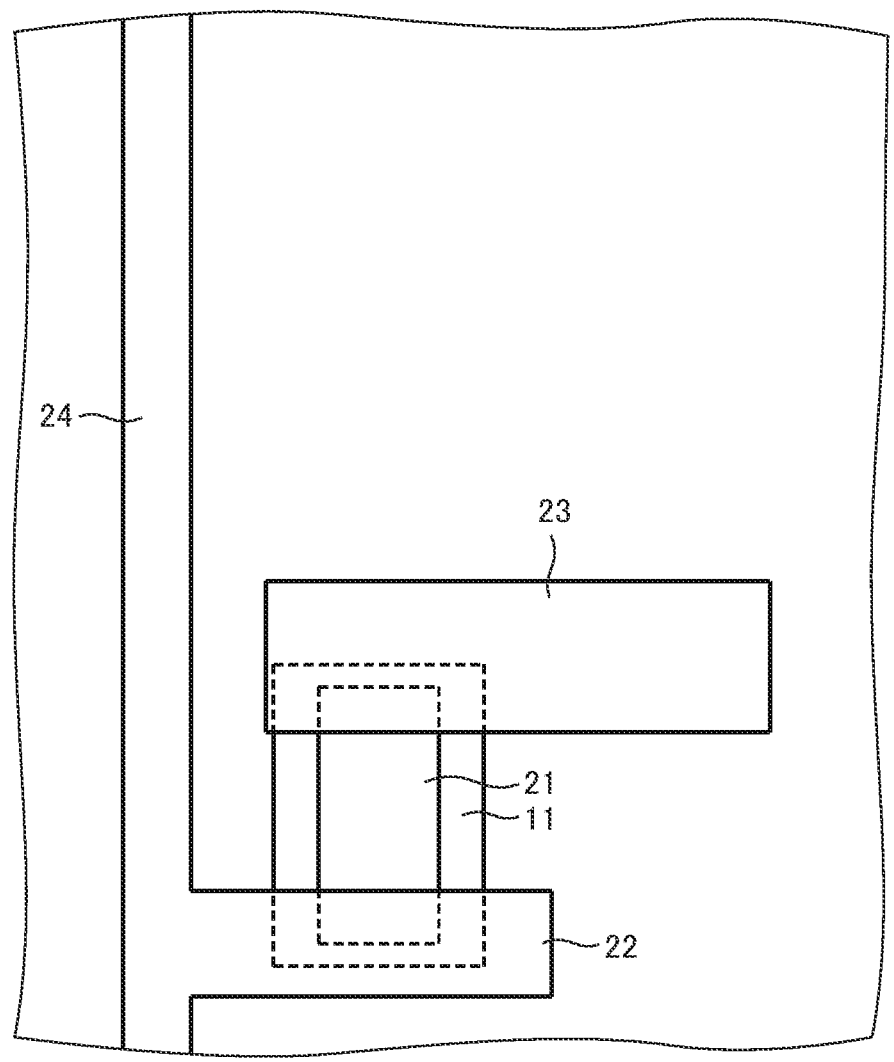
FIG. 6 is a plan view of the substrate illustrating a step of the TFT array substrate producing process.
Figure 7:
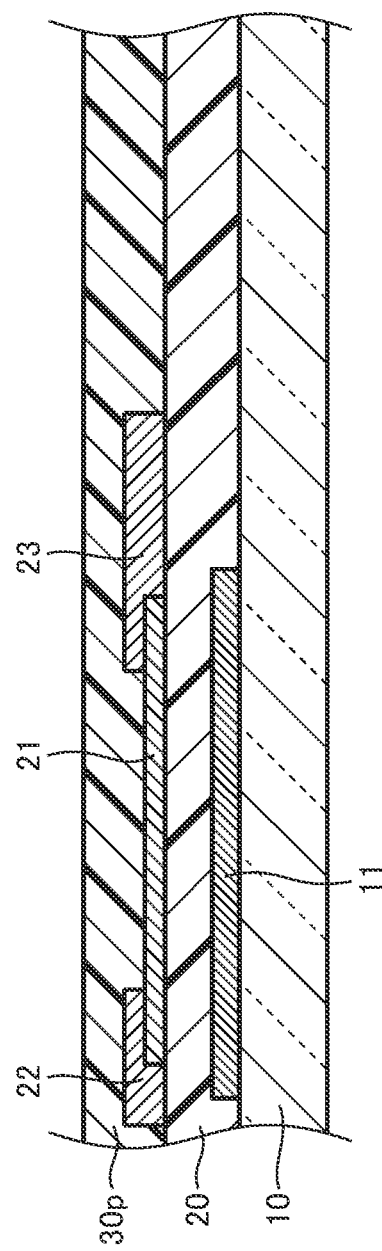
FIG. 7 is a cross-sectional view taken along line B-B in FIG. 6.

Next, as illustrated in FIGS. 6 and 7, for example, a copper (Cu) film and a titanium (Ti) film are laminated, whereby a conductive film is formed. More specifically, for example, a copper (Cu) film and a titanium (Ti) film are formed by the sputtering method, and thereafter, the metal film thus obtained is patterned by photolithography by wet etching or dry etching, whereby a conductive film that forms the source electrode 22, the drain electrode 23, the source line 24, and the like is formed.

The conductive film, which forms the source electrode 22 and the like, may have a configuration of another metal film, examples of which are mentioned in the foregoing descriptions, or may have a single layer structure. This conductive film, however, has a two-layer structure preferably. In a case where the conductive film forming the source electrode 22 and the like has a two-layer structure, the material used for forming the lower layer is preferably a metal having a low resistance (for example, aluminum (Al), copper (Cu), etc.). The material used for forming the upper layer is preferably a metal that is hardly etched in a dry etching step in a later stage, when overetching for in-plane distribution is performed (for example, titanium (Ti), molybdenum (Mo), titanium nitride (TiN), molybdenum nitride (MoN), or the like).

Next, as illustrated in FIG. 7, an $SiN_x$ film and an $SiO_2$ film are formed in the order on the first insulating film 20 by using, for example, the PECVD method, so as to cover the conductive film forming the source electrode 22 and the like, whereby an insulating film 30p is formed. The insulating film 30p formed herein is a film that forms the gate insulating film 30.

Figure 8:
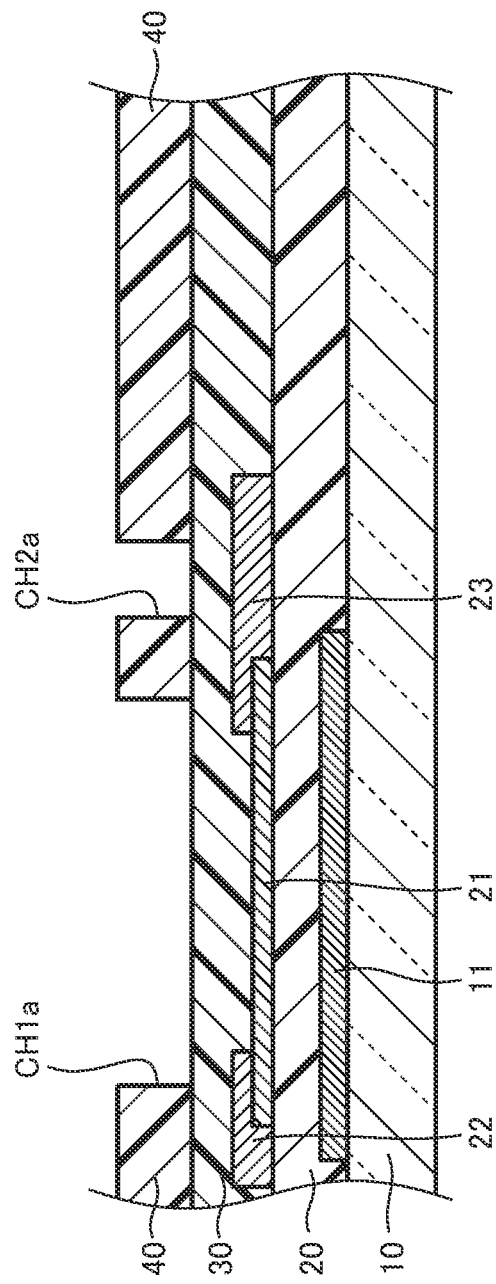
FIG. 8 is a cross-sectional view of the substrate illustrating a step of the TFT array substrate producing process.
Figure 9:
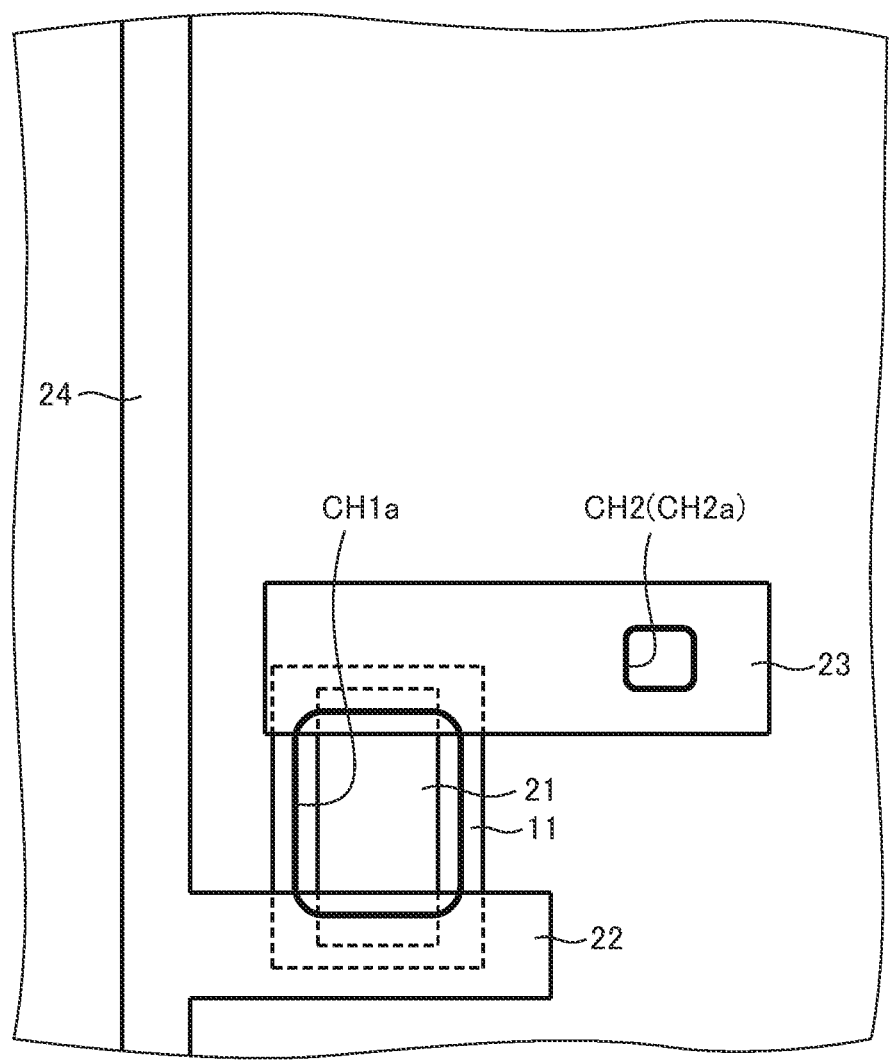
FIG. 9 is a plan view of the substrate illustrating the step of the TFT array substrate producing process.

Next, as illustrated in FIG. 8, the photosensitive resin film 40 made of an acrylic resin or the like is formed on the $SiO_2$ film. This photosensitive resin film 40 is patterned by photolithography, whereby, as illustrated in FIGS. 8 and 9, a contact hole CH1a that overlaps the semiconductor film 21, and a contact hole CH2a that overlaps the drain electrode 23, are formed. Then, the photosensitive resin film 40 is subjected to an annealing treatment.

Figure 10:
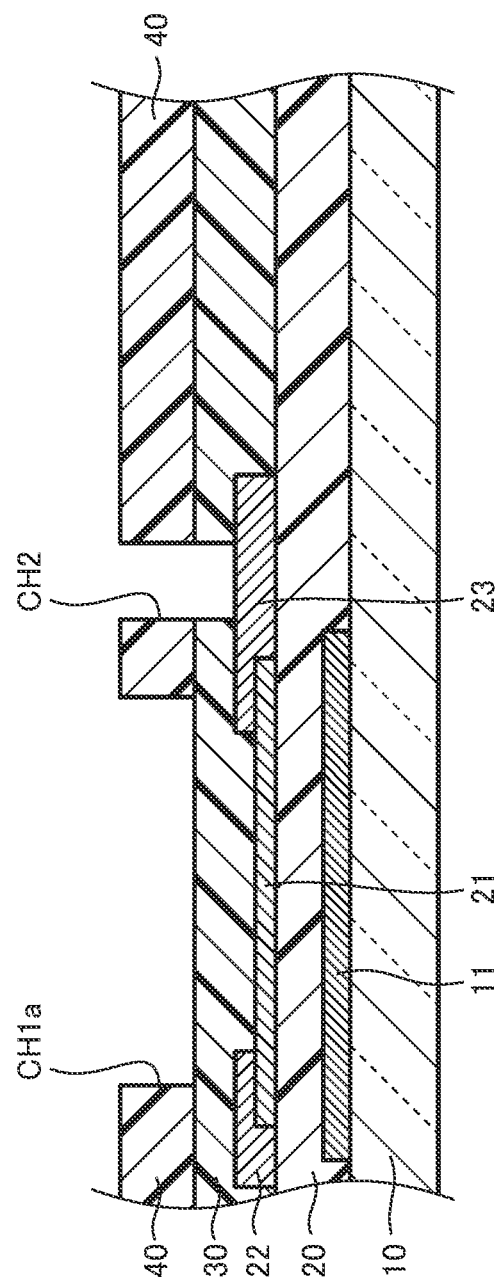
FIG. 10 is a cross-sectional view taken along line C-C in FIG. 9.

Subsequently, as illustrated in FIGS. 9 and 10, the insulating film 30p is patterned by photolithography, whereby the contact hole CH2, which extends from the surface of the photosensitive resin film 40 to the drain electrode 23, is formed.

Figure 11:
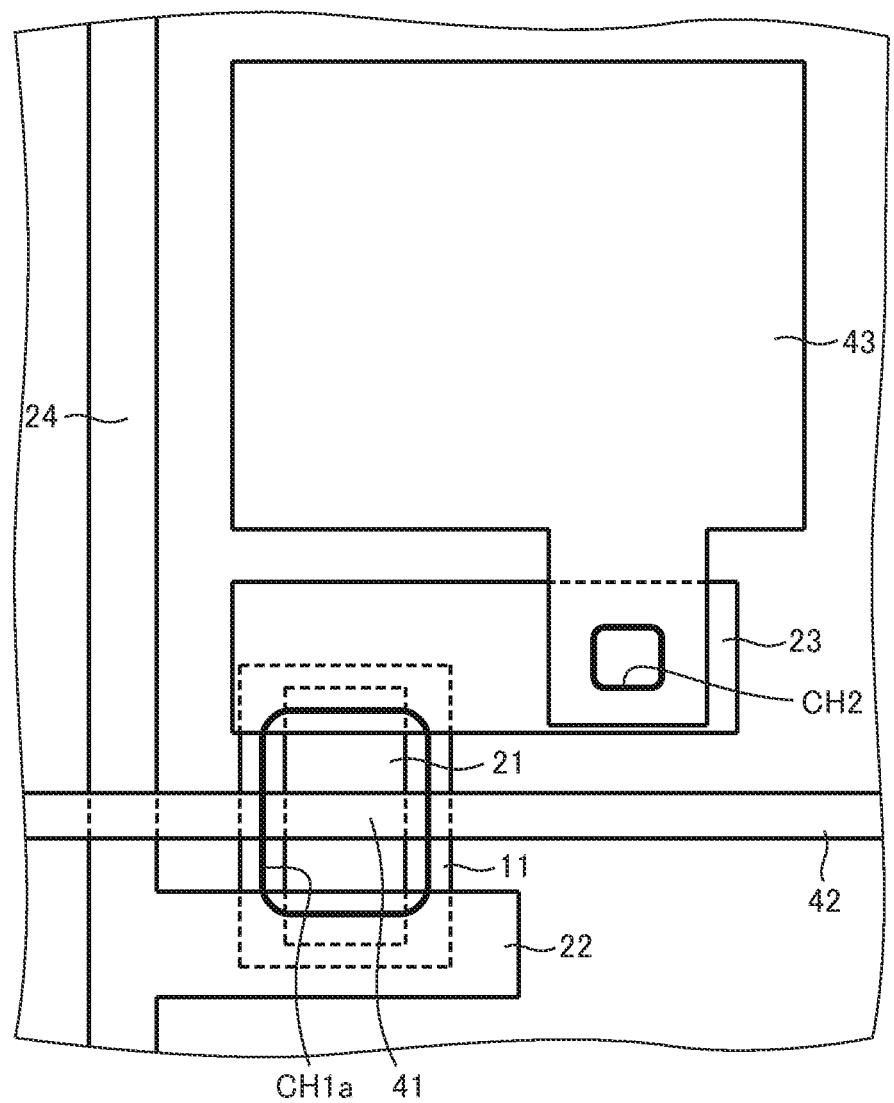
FIG. 11 is a plan view of the substrate illustrating a step of the TFT array substrate producing process.
Figure 12:
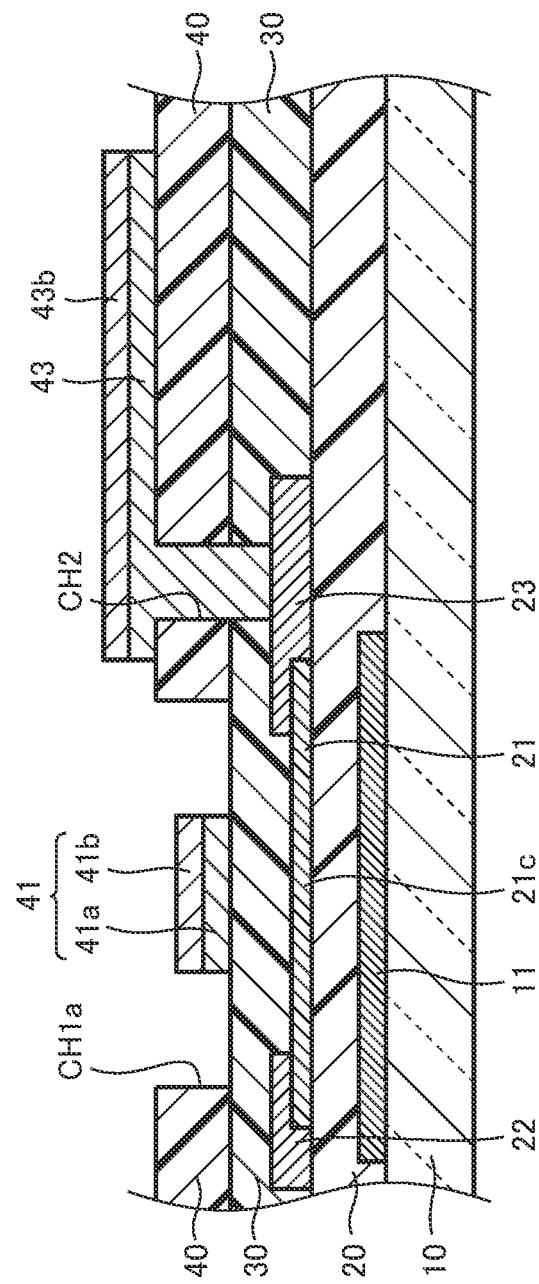
FIG. 12 is a cross-sectional view taken along line D-D in FIG. 11.

Next, as illustrated in FIGS. 11 and 12, a transparent conductive film is formed on the photosensitive resin film 40 by using, for example, the sputtering method, and further, a conductive film is laminated thereon. Then, patterning is performed by photolithography using wet etching, whereby the gate electrode 41 composed of the transparent conductive film 41a and the conductive film 41b, the gate line 42 composed of the transparent conductive film and the conductive film (see FIG. 11), and the pixel electrode 43 composed of the transparent conductive film, are formed. In the upper layer of the pixel electrode 43, the conductive film 43b in the same pattern as that of the pixel electrode 43 remains.

Figure 13:
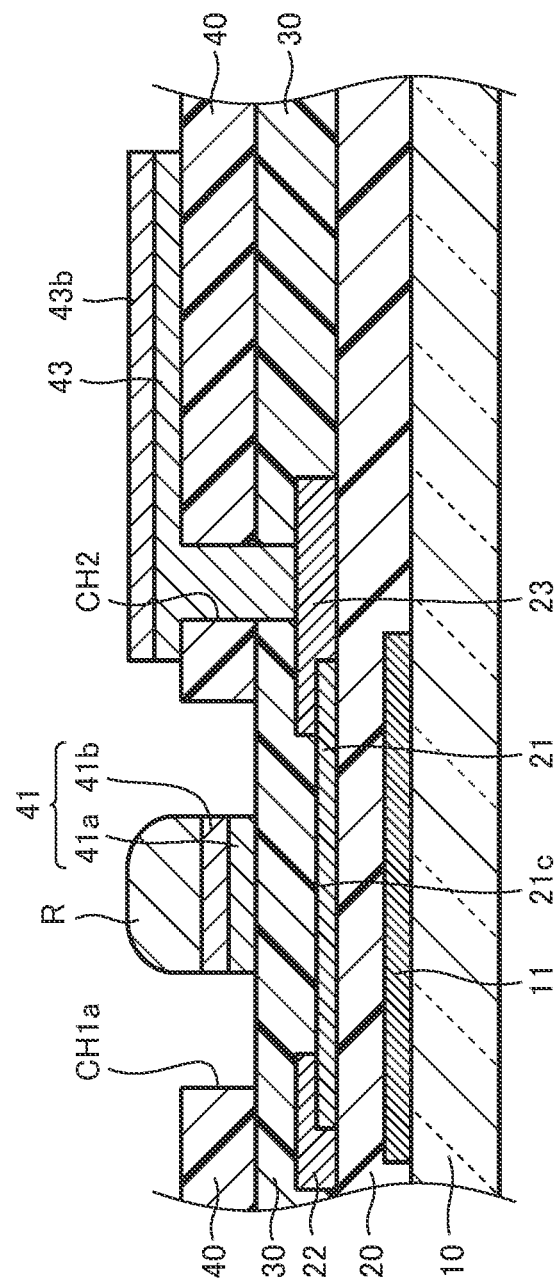
FIG. 13 is a cross-sectional view of the substrate illustrating a step of the TFT array substrate producing process.
Figure 14:
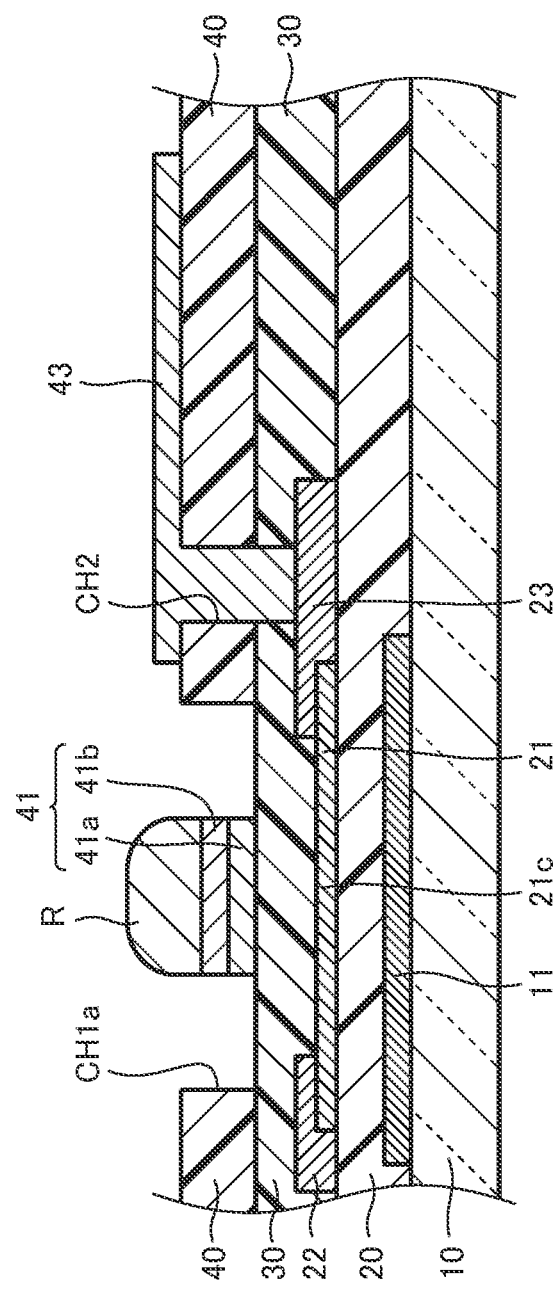
FIG. 14 is a cross-sectional view of the substrate illustrating a step of the TFT array substrate producing process.

Subsequently, as illustrated in FIG. 13, a resist R is formed in an area that overlaps with the gate electrode 41 and the gate line 42. Then, as illustrated in FIG. 14, the conductive film 43b on the pixel electrode 43 is removed by wet etching.

Figure 15:
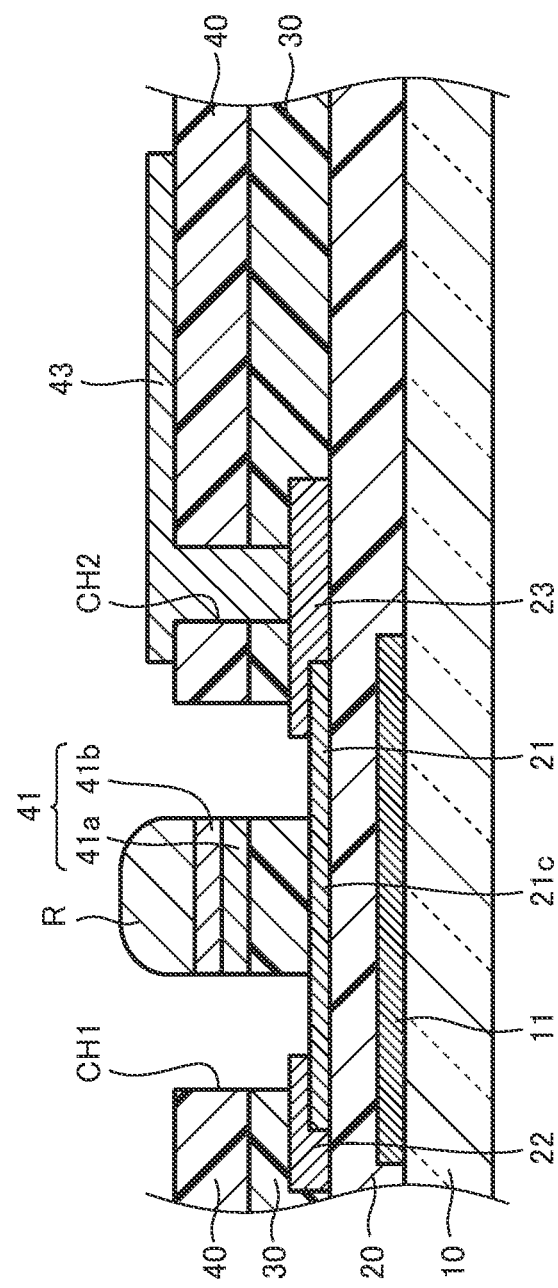
FIG. 15 is a cross-sectional view of the substrate illustrating a step of the TFT array substrate producing process.
Figure 16:
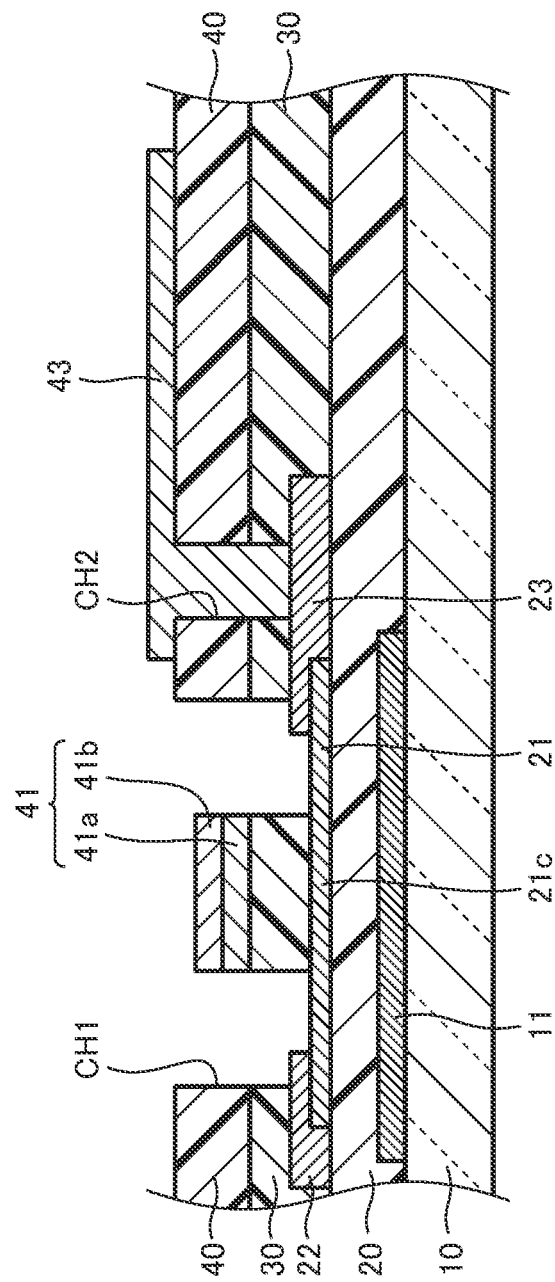
FIG. 16 is a cross-sectional view of the substrate illustrating the step of the TFT array substrate producing process.

Next, as illustrated in FIG. 15, a portion of the gate insulating film 30 in an area where the gate electrode 41 is not present, in an area that overlaps with the contact hole CH1a formed in the photosensitive resin film 40, is removed by dry etching. This causes the contact hole CH1 to be formed. Then, as illustrated in FIG. 16, the resist R formed on the gate electrode 41 is removed.

Figure 17:
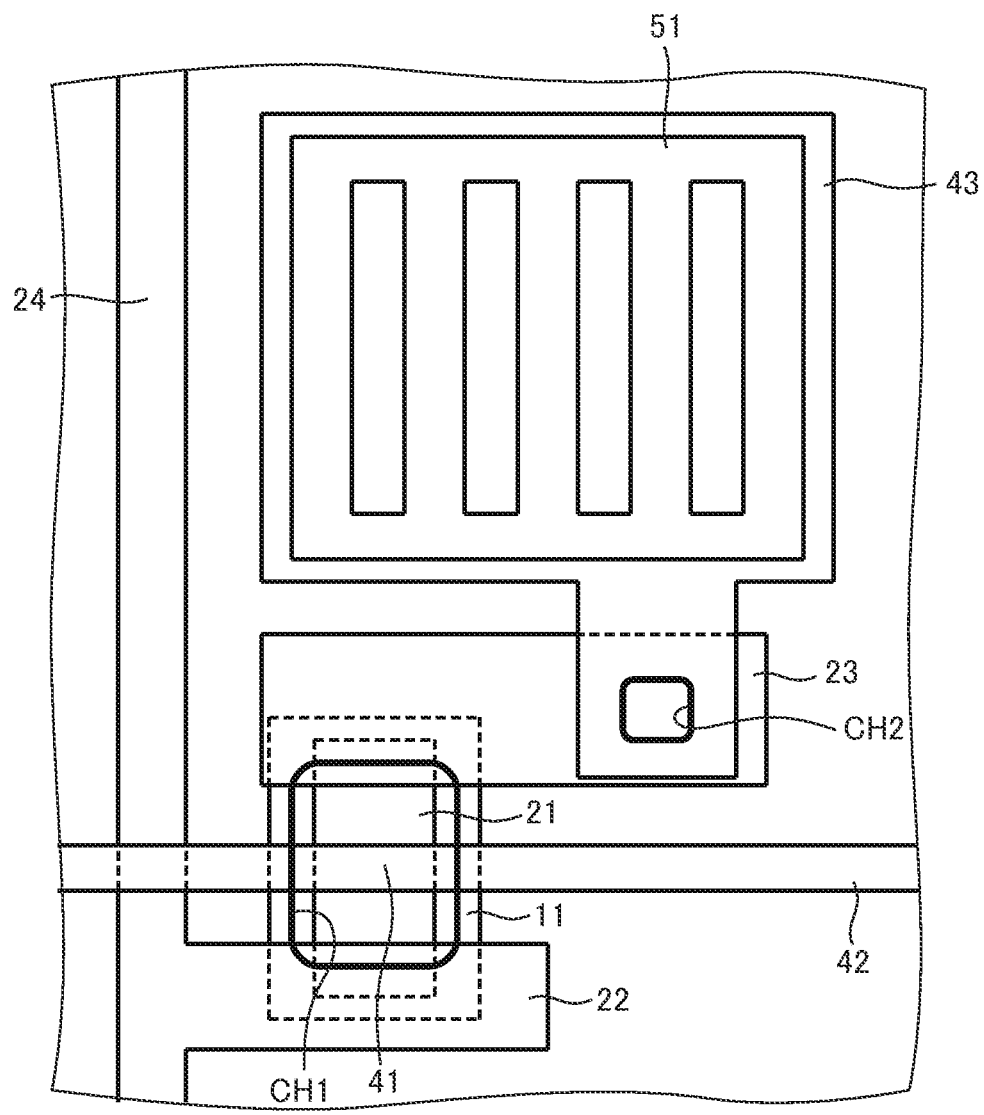
FIG. 17 is a plan view of the substrate illustrating a step of the TFT array substrate producing process.
Figure 18:
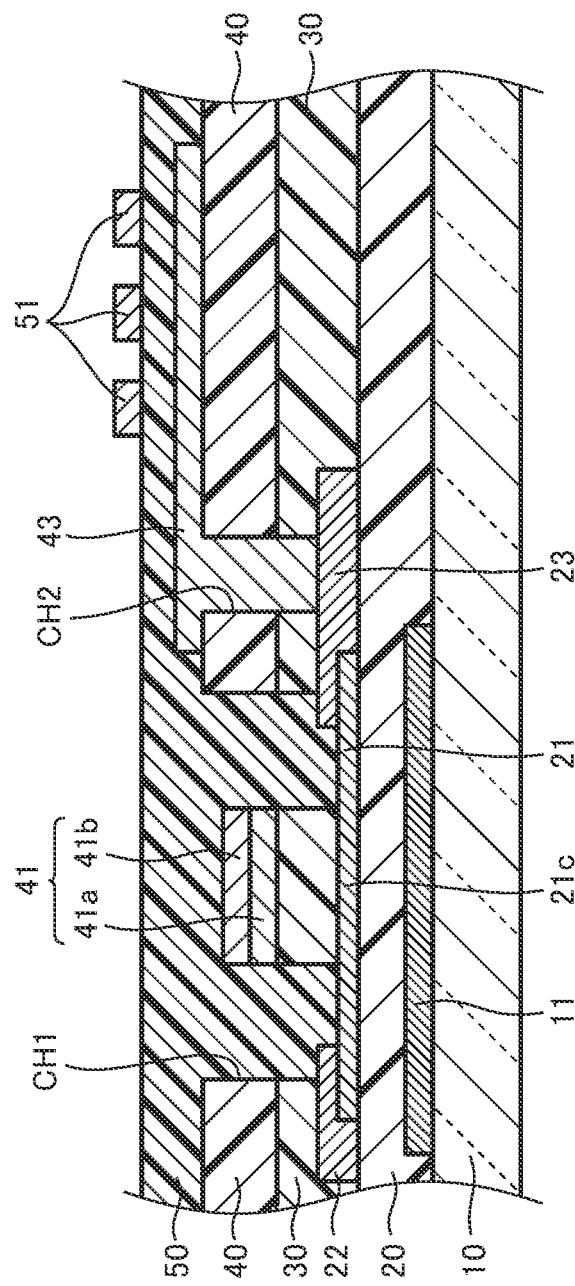
FIG. 18 is a cross-sectional view taken along line E-E in FIG. 17.

Next, as illustrated in FIGS. 17 and 18, an SiN film is formed so as to cover the photosensitive resin film 40, the pixel electrode 43, and the like, and the SiN film is etched by photolithography using dry etching, whereby the passivation film 50 is formed. Here, since the passivation film 50 is formed with use of a plasma CVD device, by using a mixture gas of $SiH_4$, $NH_3$, and $N_2$, at 250° C., the concentration of hydrogen contained in the passivation film 50 can be controlled so as to be $1 \times 10^{22}$ $cm^{-3}$ or more.

Subsequently, a transparent conductive film is formed on the passivation film 50 by using the sputtering method or the like. The transparent conductive film is patterned by photolithography using wet etching, and thereafter, the transparent conductive film is subjected to an annealing treatment, whereby the common electrode 51 is formed.

Finally, an alignment film, which is not illustrated, is formed so as to cover the passivation film 50 and the common electrode 51. Through the above-described steps, the TFT array substrate 210 is produced.

(Effects of Embodiment 1)

The TFT array substrate 210 of the present embodiment has such a structure that the gate electrodes 41 overlap with none of the source electrodes 22 and the drain electrodes 23 when viewed in a plan view. This therefore makes it possible to prevent parasitic capacitance from being generated between the gate electrodes 41 and the source electrodes 22 as well as the drain electrodes 23, which results in that the TFT array substrate 210 is characterized in short writing time.

As the writing time of the TFT array substrate 210 decreases, the time required for raising the voltage of each pixel up to a desired level can be shortened. This therefore makes it possible to prevent delay from occurring to the signals.

Further, As the writing time of the TFT array substrate 210 decreases, the time for driving the touch panel during a display driving pausing period can be increased. Since noise of display signals is prevented from influencing signals for the touch panel, the accuracy of the touch panel can be improved as a result.

The TFT array substrate 210 of the present embodiment is a top gate type semiconductor substrate, but since the semiconductor film 21 is provided so as to overlap with the light-shielding film 11 when viewed in a plan view, it is possible to prevent the semiconductor film 21 from being irradiated with light and deteriorating.

In the TFT array substrate 210 of the present embodiment, the passivation film 50 having a hydrogen concentration of $1 \times 10^{22}$ $cm^{-3}$ or more is in contact with the semiconductor film 21, which causes hydrogen to easily enter the semiconductor film 21 from the passivation film 50. When hydrogen enters the semiconductor film 21, oxygen in the semiconductor film 21 is drawn out, which causes the oxide semiconductor to have a low resistance. As a result, the movement efficiency of electrons in the semiconductor film 21 in the TFT array substrate 210 can be improved.

Other Embodiments

The present invention is not limited to the embodiment described above with reference to the drawings, and, for example, the following embodiments fall in the technical scope of the present invention.

Figure 19:
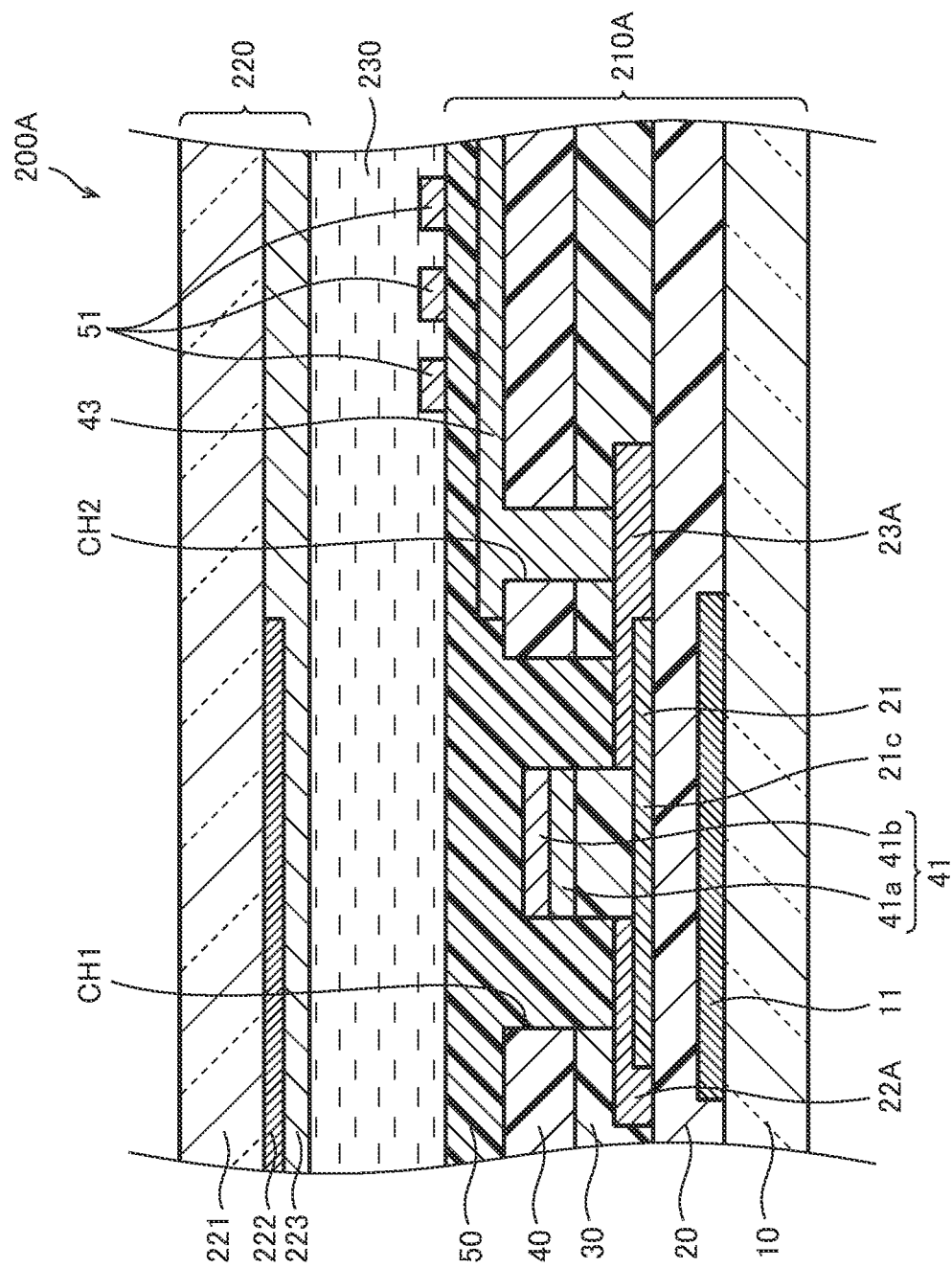
FIG. 19 is a cross-sectional view of a TFT array substrate of a modification example.

Embodiment 1 has a configuration in which the semiconductor film 21 and the passivation film 50 are in direct contact with each other, but the configuration may be as follows: as illustrated in FIG. 19, in a TFT array substrate 210A in a liquid crystal display panel 200A, areas thereof other than channel areas 21c of the semiconductor film 21 are covered with a source electrode 22A or a drain electrode 23A. In this case as well, the source electrode 22A or the drain electrode 23A, and the gate electrode 41, are arranged so as not to overlap with each other when viewed in a plan view, which makes it possible to prevent a parasitic capacitance from being generated therebetween.

In the above-described embodiment, the semiconductor film is formed with an oxide semiconductor film, but the material of the semiconductor film is not limited to those described above. For example, the semiconductor film may be made of polysilicon.

Each of the TFT array substrates in the above-described embodiments may further include auxiliary capacitance lines that form auxiliary capacitors used for holding voltages applied to the liquid crystal.

In the above-described embodiment, the operation mode of the liquid crystal display panel 200 is the FFS mode, but the configuration of the display device of the present invention is not particularly limited to this. The liquid crystal display panel of the present invention may be, for example, the TN mode or the like.

The description of the above-described embodiment mentions a case where the display device is a liquid crystal display device, but the display device of the present invention may be a display device other than the liquid crystal display device. For example, the present invention may be applied to a display device such as an organic EL display device.

The above-described embodiments are merely examples for implementing the present invention. The present invention, therefore, is not limited to the above-described embodiments, and the above-described embodiments can be appropriately varied and implemented without departing from the spirit and scope of the invention.

INDUSTRIAL APPLICABILITY

The present invention is applicable to a semiconductor substrate and a display device.

DESCRIPTION OF REFERENCE NUMERALS

CH1: contact hole
100: liquid crystal display device (display device)
210: TFT array substrate (semiconductor substrate)
10: transparent substrate (substrate)
11: light-shielding film
20: first insulating film
21: semiconductor film
22: source electrode
23: drain electrode
30: gate insulating film (second insulating film)
40: passivation film (third insulating film)
41: gate electrode

The invention claimed is:

1. A semiconductor substrate comprising:
a substrate;
a light-shielding film provided on the substrate;
a first insulating film provided on the substrate so as to cover the light-shielding film;
a semiconductor film provided on the first insulating film so as to overlap with the light-shielding film when viewed in a plan view;
a source electrode and a drain electrode provided on the first insulating film so that a part of the same covers the semiconductor film;
a second insulating film provided on the first insulating film so as to cover the semiconductor film, the source electrode, and the drain electrode, the second insulating film having a contact hole that reaches the source electrode and the drain electrode;
a gate electrode provided on the second insulating film so as to overlap with the semiconductor film when viewed in a plan view, and at the same time, so as to overlap with none of the source electrode and the drain electrode when viewed in a plan view; and
a third insulating film provided on the second insulating film so as to cover the gate electrode, and at the same time, so as to be in contact with the source electrode and the drain electrode through the contact hole.

2. The semiconductor substrate according to claim 1, wherein the third insulating film, in contact with the source electrode and the drain electrode through the contact hole, is further in contact with the semiconductor film, and
the third insulating film has a hydrogen concentration of $1 \times 10^{22}$ cm$^{-3}$ or more.

3. The semiconductor substrate according to claim 1, wherein the semiconductor film is made of an oxide semiconductor.

4. The semiconductor substrate according claim 3, wherein the semiconductor film is made of an In—Ga—Zn—O-based oxide semiconductor.

5. The semiconductor substrate according to claim 3, wherein the semiconductor film is made of a crystalline oxide semiconductor.

6. A display device comprising the semiconductor substrate according to claim 1.

* * * * *